(12) United States Patent
Park

(10) Patent No.: US 8,431,472 B2
(45) Date of Patent: Apr. 30, 2013

(54) SEMICONDUCTOR DEVICE FABRICATION USING GATE SUBSTITUTION

(75) Inventor: Chang Seo Park, Clifton Park, NY (US)

(73) Assignee: Globalfoundries, Inc., Grand Cayman (KY)

( * ) Notice: Subject to any disclaimer, the term of this patent is extended or adjusted under 35 U.S.C. 154(b) by 15 days.

(21) Appl. No.: 13/174,257

(22) Filed: Jun. 30, 2011

(65) Prior Publication Data

US 2013/0005131 A1    Jan. 3, 2013

(51) Int. Cl.
*H01L 21/44* (2006.01)

(52) U.S. Cl.
USPC ........... 438/591; 438/238; 438/648; 438/778; 257/E21.194; 257/E21.202; 257/E21.204

(58) Field of Classification Search .................. 438/238, 438/587, 795; 257/368, 369, E21.2, E21.19, 257/E21.204
See application file for complete search history.

(56) References Cited

U.S. PATENT DOCUMENTS

| | | | | |
|---|---|---|---|---|
| 5,693,557 A | * | 12/1997 | Hirao et al. | 438/398 |
| 6,399,484 B1 | * | 6/2002 | Yamasaki et al. | 438/648 |
| 7,838,356 B2 | | 11/2010 | Kirkpatrick et al. | |
| 2002/0192938 A1 | * | 12/2002 | Wada et al. | 438/618 |
| 2006/0246740 A1 | * | 11/2006 | Cartier et al. | 438/778 |
| 2007/0128791 A1 | * | 6/2007 | Iwaki | 438/238 |
| 2008/0224235 A1 | | 9/2008 | Lavoie et al. | |

* cited by examiner

*Primary Examiner* — Charles Garber
*Assistant Examiner* — Abdulfattah Mustapha
(74) *Attorney, Agent, or Firm* — Ingrassia Fisher & Lorenz, P.C.

(57) ABSTRACT

Methods is provided for forming a CMOS device. The method includes providing a substrate and depositing a gate stack on the substrate. The gate stack includes a gate dielectric and a dummy gate including polycrystalline silicon (polySi). The method also includes depositing a dielectric layer on the substrate after depositing the gate stack on the substrate. The method further includes substituting the dummy gate with a metal without first removing the dummy gate.

19 Claims, 8 Drawing Sheets

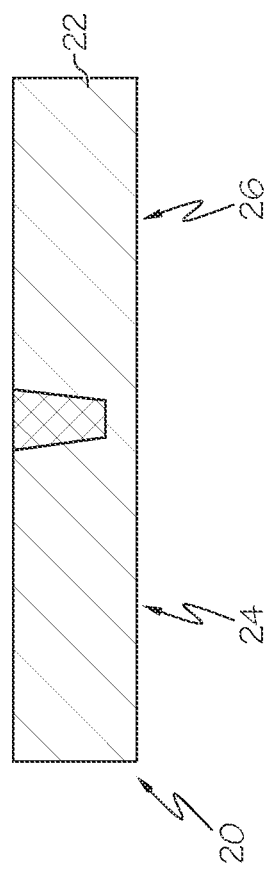
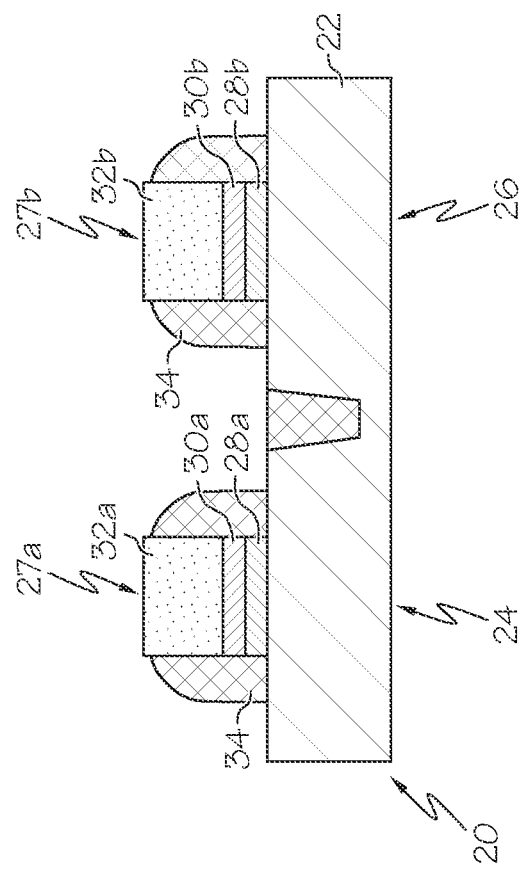

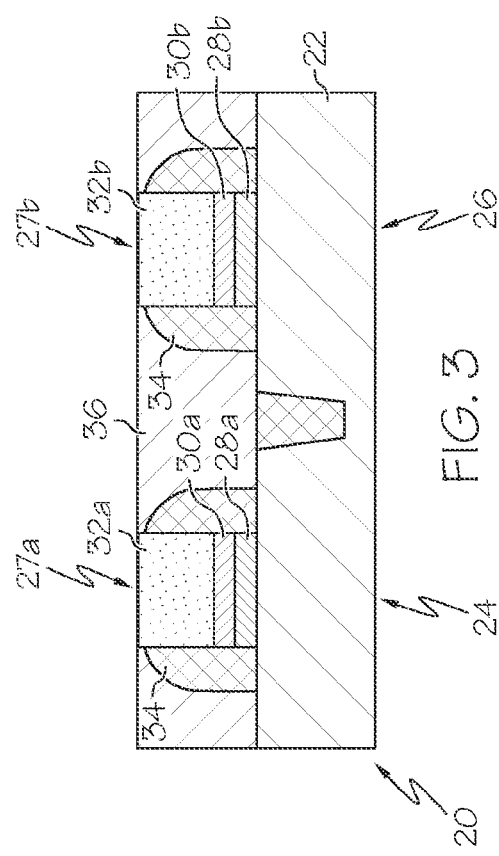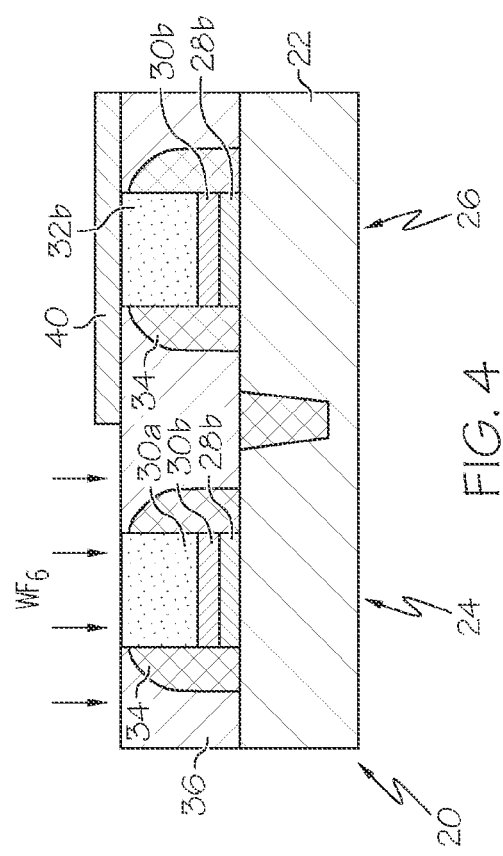

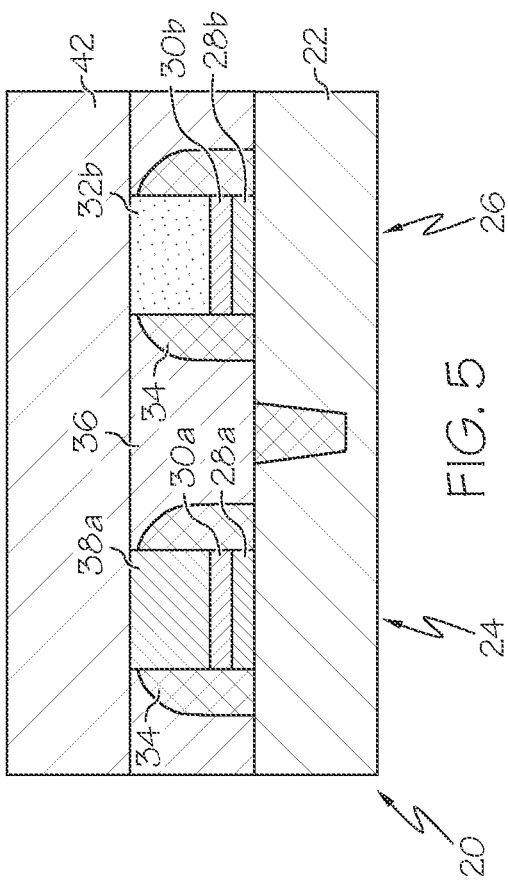
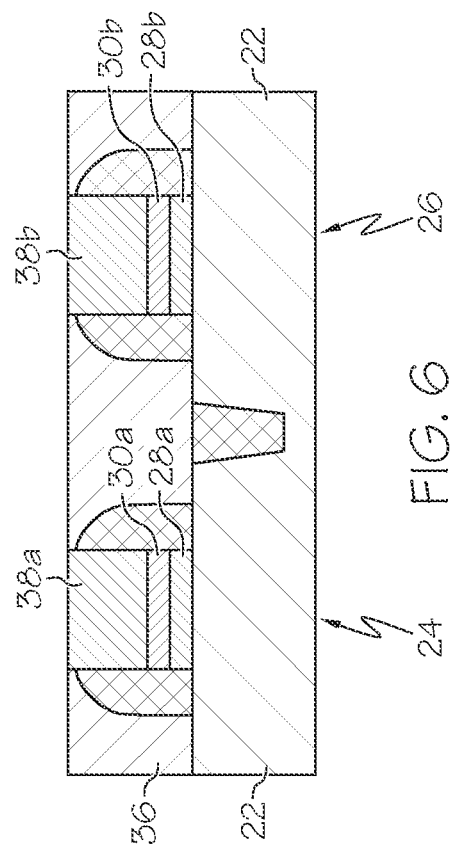

SEMICONDUCTOR DEVICE FABRICATION USING GATE SUBSTITUTION

FIELD OF THE INVENTION

The present invention generally relates to semiconductor fabrication, and more particularly relates to a method of complementary metal-oxide-semiconductor (CMOS) device fabrication.

BACKGROUND

In the production of high-k metal gate (HKMG) transistors, two main techniques are implemented with respect to the order of gate formation. In a gate-last process, often referred to as metal inserted poly-silicon (MIPS), a metal gate is deposited after a high-temperature annealing of the transistors. In a gate-first process, typically referred to as replacement metal gate (RMG), the metal gate is deposited before the high-temperature annealing.

A common RMG process utilizes a dummy polycrystalline silicon (polySi) gate which must be removed before the metal gate may be implemented. This additional step requires cumbersome masking and etching of the device to remove the polySi. The metal for the gate must then be applied to the voids formed by removal of the polySi. This application of metal also forms gaps, which must later be filled, typically with aluminum.

Accordingly, it is desirable to provide a technique of replacing the polySi dummy gate without the cumbersome etching. In addition, it is desirable to provide a technique of conveniently filling gaps formed in the metal gates. Furthermore, other desirable features and characteristics of the present invention will become apparent from the subsequent detailed description of the invention and the appended claims, taken in conjunction with the accompanying drawings and this background of the invention.

BRIEF SUMMARY

Methods are provided for forming a semiconductor device. One method includes providing a substrate and depositing a gate stack on the substrate. The gate stack includes a gate dielectric and a dummy gate includes polycrystalline silicon (polySi). The method also includes depositing a dielectric layer on the substrate after depositing the gate stack on the substrate. The method further includes substituting the dummy gate with a metal without first removing the dummy gate.

Another method includes providing a substrate and depositing a first gate stack having a first gate dielectric and a first dummy gate comprising polySi on the substrate. A second gate stack having a second gate dielectric and a second dummy gate comprising polySi is also deposited on the substrate. The method further includes depositing a dielectric layer on the substrate after depositing the gate stacks on the substrate. The first dummy gate is substituted with a metal without first removing the first dummy gate. The second dummy gate is also substituted with a metal without first removing the second dummy gate.

BRIEF DESCRIPTION OF THE DRAWINGS

The present invention will hereinafter be described in conjunction with the following drawing Figures, wherein like numerals denote like elements, and FIGS. 1-6 show cross-sectional side views of a semiconductor device at various stages of manufacture;

DETAILED DESCRIPTION

Figure 8:
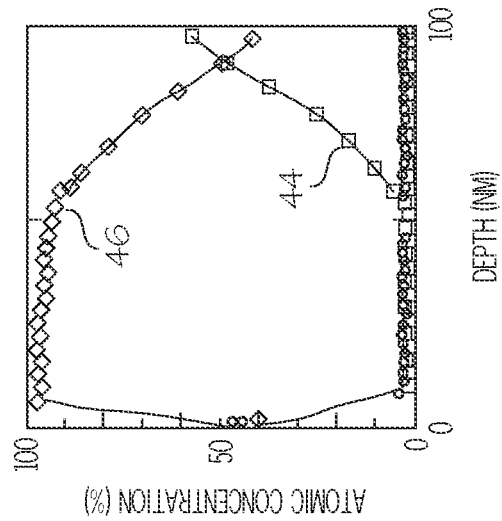
FIG. 8 is a graph showing atomic concentration of the oversized sample of the first dummy gate after exposure to tungsten hexafluoride.

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to the Figures, wherein like numerals indicate like parts throughout the several views, a method of forming a semiconductor device 20 is shown and described herein. The semiconductor device 20 of the illustrated embodiment is more specifically a complementary metal-oxide-semiconductor (CMOS) device (not separately numbered). CMOS devices, as is well known to those skilled in the art, combine p-type and n-type metal-oxide-semiconductor field-effect transistors (MOSFETs).

Referring to FIG. 1, the semiconductor device 20 includes a substrate 22. In the illustrated embodiment, the substrate 22 includes silicon (Si), however other suitable semiconductor surface materials are well known to those skilled in the art. The substrate 22 of the illustrated embodiment defines a PMOS region 24 and an NMOS region 26. Those skilled in the art realize that the PMOS and NMOS regions 24, 26 are doped to create sources (not shown) and drains (not shown) for the associated transistors. Furthermore, the semiconductor device 20 may include a very high number of PMOS regions 24 and NMOS regions 26 to form the transistors (not separately numbered) and associated logic elements (not separately numbered). However, for the purposes of simplicity in describing the method, only a single PMOS region 24 and a single NMOS region 26 are shown.

Referring now to FIG. 2, the method includes depositing a gate stack 27 on the substrate 22. Specifically, in the illustrated embodiment, a first gate stack 27a is deposited in the PMOS region and a second gate stack 27b is deposited in the NMOS region 26. The gate stack 27 of the illustrated embodiment includes a dielectric layer 28, a metal layer 30, a dummy gate 32, and a spacer 34. In other embodiments (not shown), some of these elements may not be included as part of the gate stack 27, as is appreciated by those skilled in the art.

The dielectric layer 28 of the gate stack 27 is disposed on the substrate 22. Specifically, in the illustrated embodiment, the first gate stack 27a includes a first gate dielectric layer 28a disposed in the PMOS region 24 and the second gate stack 27b includes a second gate dielectric layer 28b disposed in the NMOS region 26. The gate dielectric layers 28 of the illustrated embodiment include a high-k dielectric material. The high-k dielectric material has a high dielectric constant with respect to silicon dioxide. Generally, the high-k dielectric material has a relative dielectric constant (κ) greater than 20. Those skilled in the art realize numerous suitable high-k dielectric materials that may be implemented as the gate dielectric layer 28.

The metal layer 30 of the gate stack 27 is disposed on the gate dielectric layer 28. As such, the gate dielectric layer 28 is sandwiched by the metal layer 30 and the substrate 22. Specifically, in the illustrated embodiment, a first metal layer 30a is disposed on the first gate dielectric layer 28a and a second metal layer 30b is disposed on the second gate dielectric layer 28b. The metal layer 30 in the illustrated embodiment includes titanium nitride (TiN). However, those skilled in the art realize other suitable metals that may be implemented as the metal layer 30.

The dummy gate 32 of the gate stack 27 is disposed on the gate dielectric layer 28 and/or the metal layer 30. Specifically, in the illustrated embodiment, the first gate stack 27a includes a first dummy gate 32a disposed on the first metal layer 30a and the second gate stack 27b includes a second dummy gate 32b disposed on a second metal layer 32b. The dummy gate 32 includes polycrystalline silicon, commonly referred to as polysilicon and typically abbreviated as polySi. The dummy gate 32 is preferably 100 nanometers (nm) or less in height/thickness.

The spacer 34 of the illustrated embodiment is disposed around the dielectric layer 28, the metal layer 30, and the dummy gate 30. The spacer 34 includes a generally non-conductive material to insulate the dielectric layer 28, the metal layer 30, and the dummy gate 30 from other components, as is well known to those skilled in the art.

Referring now to FIG. 3, the method continues with depositing a dielectric layer 36 on the substrate 22 after the gate stack 27 is formed on the substrate 22. The dielectric layer 36 is deposited in the PMOS and the NMOS regions 24, 26. As such, in the illustrated embodiment, the dielectric layer 36 surrounds the first and second gate stacks 27a, 27b. The dielectric layer 36 may be formed of silicon oxide as is appreciated by those skilled in the art. The dielectric layer 36 is then planarized and the polySi of the dummy gate 32 is opened, as appreciated by those skilled in the art.

After the dielectric layer 36 is deposited and planarized, the method proceeds by substituting the dummy gate 32 with a metal gate 38 without first removing the dummy gate 32. As explained above, in prior art CMOS device fabrication utilizing replacement gate techniques, dummy gates are typically etched away using a wet or dry etching techniques, as understood by those skilled in the art. However, in the method described herein, the dummy gate 32 is not removed with an etching process. As such, a significant time savings can be achieved by the methods described herein.

Specifically, in the illustrated embodiment, the method proceeds by covering the second dummy gate 32b with a hardmask 40, as shown in FIG. 4. The hardmask 40 protects the second dummy gate 32b as explained in further detail below.

After the hardmask 40 is installed, the method of the illustrated embodiment proceeds by substituting the first dummy gate 32a with a metal. Specifically, this substitution is achieved by treating the first dummy gate 32a with tungsten hexafluoride ($WF_6$), as is shown in FIG. 5. Specifically the exposed polySi of the first dummy gate 32a reacts with the $WF_6$ as follows: $3Si+2WF_6 \text{ (gas)} \rightarrow 2W+3SiF_4 \text{ (gas)}$. When applying the $WF_6$ gas to the first dummy gate 32a, the molecules of polySi are replaced with molecules of the metal tungsten (W). That is, silicon (Si) is consumed and substituted for tungsten (W).

Figure 7:
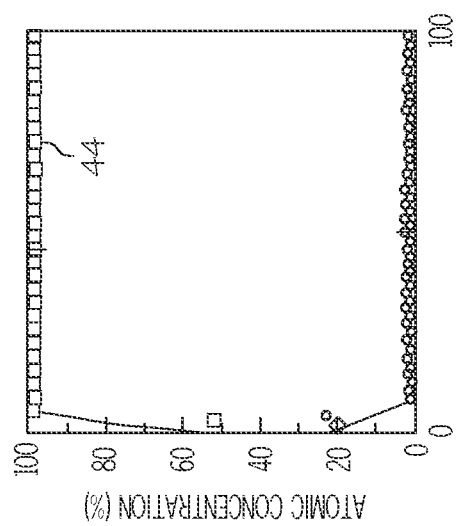
FIG. 7 is a graph showing atomic concentration of an oversized sample of a first dummy gate prior to metal substitution.

An example of this substitution can be seen with reference to FIGS. 7 and 8. In FIGS. 7 and 8, the vertical axis shows the percentage of atomic concentration and the horizontal axis shows the depth of the first dummy gate 32a in nanometers. Silicon (Si) is shown in curve 44 and tungsten (W) is shown in curve 46. Specifically, FIG. 7 shows the atomic concentration of a 100 nm deep sample of the polySi prior to the $WF_6$ application. After application of the $WF_6$, the sample has been substantially converted to tungsten, as can be seen in FIG. 8.

Figure 9:
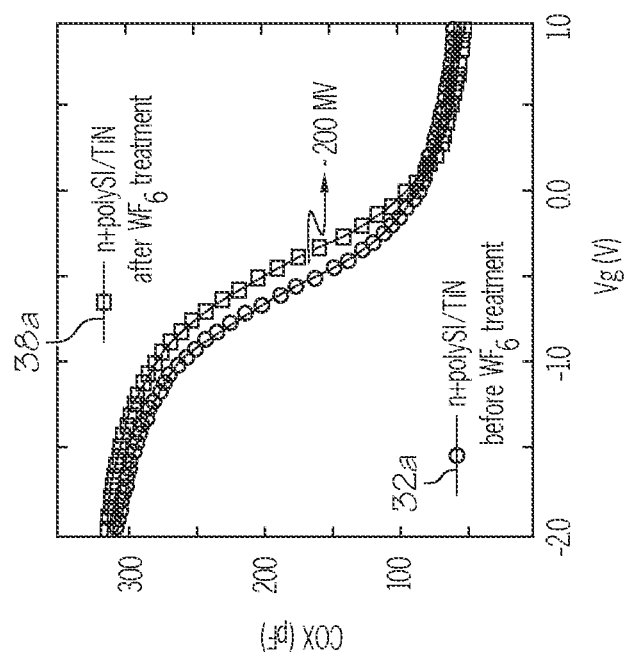
FIG. 9 is a graph showing the capacitance-voltage characteristics of the first dummy gate before and after exposure to the tungsten hexafluoride.
Figure 10:
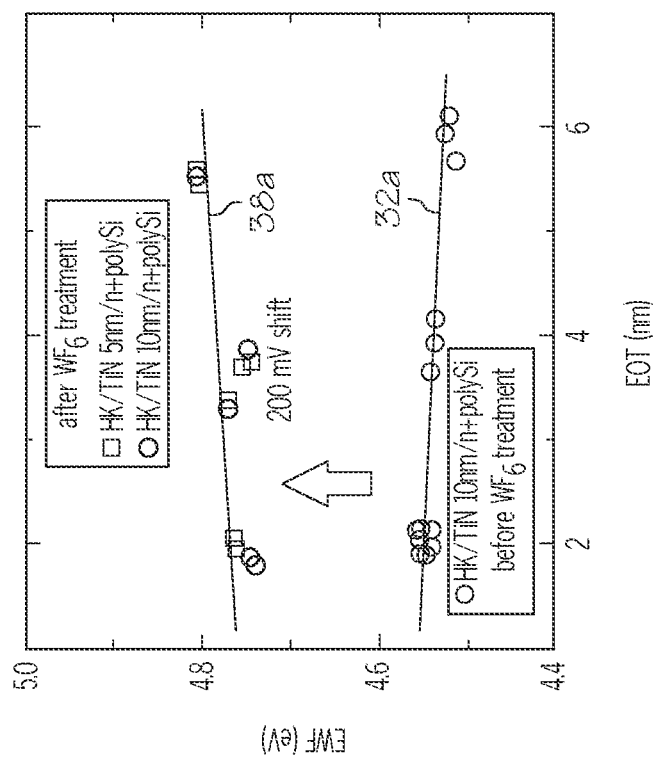
FIG. 10 is a graph showing the work function shift of the first dummy gate before and after exposure to the tungsten hexafluoride.

FIGS. 9 and 10 show electrical characteristics of the first dummy gate 32a before the $WF_6$ application and the tungsten gate 38a after the $WF_6$ application. In FIG. 9, the vertical axis shows the oxide capacitance ($C_{ox}$) and the horizontal axis shows the gate voltage ($V_g$), such that FIG. 9 shows the capacitance-voltage characteristics of the gates 32a, 38a. In FIG. 10, the vertical axis shows the effective work function (EWF) in electron-volts and the horizontal axis shows the equivalent oxide thickness (EOT) in nanometers. Both FIGS. 9 and 10 indicate a 200 mV shift occurring in the gates 32a, 38a after the $WF_6$ application.

The hardmask 40 covering the second dummy gate 32b prevents this gate from being substituted with W. After the application of the $WF_6$ to the first dummy gate 32a (i.e., the tungsten gate 38a) has concluded, the hardmask 40 is removed from the second dummy gate 32b.

After the hardmask 40 has been removed, the method of the illustrated embodiment proceeds by substituting the second dummy gate 32b with a metal. Specifically, in the illustrated embodiment, and as shown in FIG. 5, an aluminum (Al) layer 42 is deposited on the second dummy gate 32b. The aluminum of the aluminum layer 42 is then annealed. The annealing of the aluminum in the illustrated embodiment is performed below 450° C. During the annealing, the aluminum is diffused into the polySi. That is, the molecules of the polySi of the second dummy gate 32b are replaced with molecules of aluminum, to generate an aluminum gate 38b. Tungsten is a known barrier for aluminum diffusion, such that the tungsten gate 38a is not affected by the aluminum deposition and annealing, so no separate hardmask of the tungsten gate 38a is needed.

Figure 11:
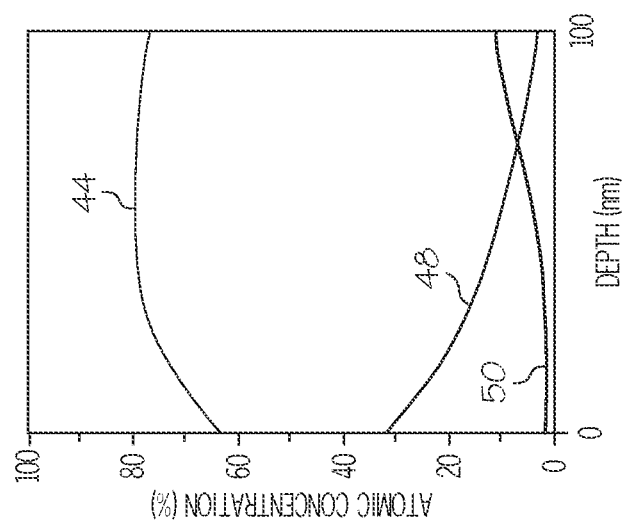
FIG. 11 is a graph showing atomic concentration of a second dummy gate prior to annealing.
Figure 12:
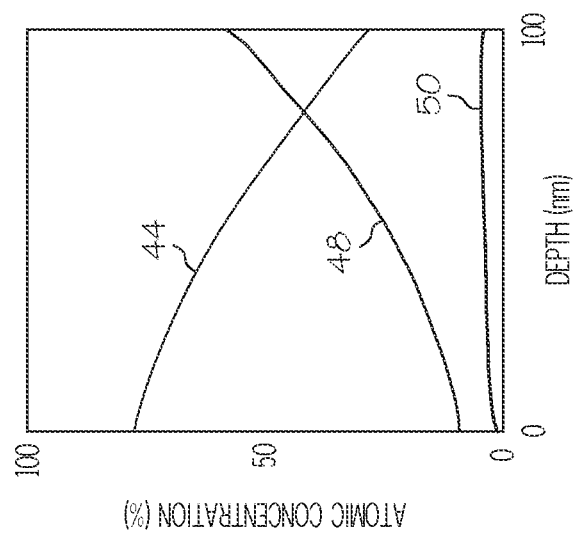
FIG. 12 is a graph showing atomic concentration of the second dummy gate and after annealing.

An example of this substitution can be seen with reference to FIGS. 11 and 12. Specifically, FIG. 11 shows the atomic concentration of the second dummy gate 32b prior to annealing in a cross-sectional fashion. Silicon (Si) is shown in curve 44, aluminum (Al) is shown in curve 48, and oxygen (O) is shown in curve 50. After annealing, the second dummy gate 32b been converted to primarily aluminum (Al), as can be seen with reference to FIG. 12. In practice, where the second dummy gate 32b is sized to have a depth of 100 nm or less, all or nearly all of the second dummy gate 32b is substituted with an aluminum gate 38b.

As can be seen with reference to FIG. 5, in the illustrated embodiment, the aluminum may be deposited on the first dummy gate 32a and the dielectric layer 36 in addition to the second dummy gate 32b. The aluminum does not react with the $SiO_2$ during annealing. Also, as stated above, tungsten is a known barrier for aluminum diffusion, such that the tungsten gate 38a is not affected by the aluminum deposition and annealing. After annealing, the excess aluminum may be removed to a certain level to expose the tungsten and aluminum gates 38a, 38b, as shown in FIG. 6. For instance, polishing techniques known by those skilled in the art may be utilized to remove the aluminum layer 42.

By applying the aluminum layer 42 in this manner, not only is the removal of second dummy gate 32a by etching eliminated, but a "gap-fill" step, as is typically required in replacement metal gate processes, is no longer needed. Specifically, gaps in metal gates are never created and as such, the methods described herein obviate the need for this additional costly and delicate gap-fill process.

A titanium (Ti) capping layer (not shown) may also be added on top of the aluminum layer 42 prior to the annealing process. This added step improves the uniformity of the reaction of the aluminum and the polySi during annealing.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of forming a semiconductor device, said method comprising:
   providing a substrate;
   depositing a gate stack having a gate dielectric and a dummy gate comprising polycrystalline silicon (polySi) on the substrate;
   depositing a dielectric layer on the substrate after depositing the gate stack on the substrate;
   depositing aluminum on the dummy gate; and
   annealing the aluminum to substitute the entire dummy gate with the aluminum deposited on the dummy gate to generate an aluminum gate.

2. A method as set forth in claim 1 wherein depositing the dielectric layer is performed prior to depositing the aluminum and annealing the aluminum.

3. A method as set forth in claim 1 wherein depositing aluminum on the dummy gate is further defined as depositing aluminum on the dummy gate and the dielectric layer.

4. A method as set forth in claim 1 wherein annealing the aluminum is further defined as annealing the aluminum at a temperature less than 450° C.

5. A method as set forth in claim 1 wherein substituting the dummy gate further comprises removing the aluminum to a certain level after annealing.

6. A method as set forth in claim 1 further comprising depositing a titanium layer on top of the aluminum prior to the annealing for improving the uniformity of the reaction of the aluminum and the polySi during annealing.

7. A method as set forth in claim 1 wherein depositing a gate stack having a gate dielectric comprises depositing a layer of a high-k dielectric.

8. A method of forming a semiconductor device, said method comprising:
   providing a substrate;
   depositing a first gate stack having a first gate dielectric and a first dummy gate comprising polySi on the substrate;
   depositing a second gate stack having a second gate dielectric and a second dummy gate comprising polySi on the substrate;
   depositing a dielectric layer on the substrate after depositing the gate stacks on the substrate;
   substituting the first dummy gate with a metal after depositing the dielectric layer and without first removing the first dummy gate; and
   substituting the second dummy gate with a metal after depositing the dielectric layer and without first removing the second dummy gate.

9. A method as set forth in claim 8 further comprising covering the second dummy gate with a hardmask.

10. A method as set forth in claim 9 wherein substituting the first dummy gate is further defined as treating the first dummy gate with tungsten hexafluoride ($WF_6$) after the second dummy gate has been covered with the hardmask.

11. A method as set forth in claim 10 further comprising the step of removing the hardmask from the second dummy gate after the first dummy gate has been treated with the $WF_6$.

12. A method as set forth in claim 11 wherein said step of substituting the second dummy gate includes depositing aluminum on the second dummy gate after removal of the hardmask.

13. A method as set forth in claim 12 wherein said step of substituting the second dummy gate includes annealing the aluminum.

14. A method as set forth in claim 13 further comprising removing the aluminum to a certain level after annealing.

15. A method as set forth in claim 12 further comprising depositing a titanium (Ti) layer on the aluminum.

16. A method as set forth in claim 12 wherein depositing a gate stack having a gate dielectric comprises depositing a layer of a high-k dielectric.

17. A method of forming a semiconductor device, said method comprising:
    providing a substrate;
    depositing a first gate stack having a first gate dielectric and a first dummy gate comprising polySi on the substrate;
    depositing a second gate stack having a second gate dielectric and a second dummy gate comprising polySi on the substrate;
    depositing a dielectric layer on the substrate after depositing the gate stacks on the substrate;
    treating the first dummy gate with tungsten hexafluoride ($WF_6$) after the second dummy gate has been covered with a hardmask such that the first dummy gate is substituted with a tungsten gate;
    removing the hardmask after the first dummy gate has been treated with the tungsten hexafluoride; and
    depositing aluminum on the tungsten gate, the dielectric layer, and on the second dummy gate after removal of the hardmask;
    annealing the aluminum such that the second dummy gate is substituted with an aluminum gate; and
    removing the aluminum to a certain level after annealing.

18. A method as set forth in claim 17 further comprising depositing a titanium (Ti) layer on the aluminum.

19. A method as set forth in claim 17 wherein depositing a gate stack having a gate dielectric comprises depositing a layer of a high-k dielectric.

* * * * *